US006442493B1

United States Patent
Jurisch et al.

(10) Patent No.: US 6,442,493 B1
(45) Date of Patent: Aug. 27, 2002

(54) METHOD OF DETECTING A FAULT IN A MONITORED SECTION OF AN ELECTRIC TRANSMISSION LINE USING DISTANCE PROTECTION TECHNIQUES

(75) Inventors: Andreas Jurisch, Berlin (DE); Tevfik Sezi, Raleigh, NC (US)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/117,612

(22) PCT Filed: Jan. 24, 1997

(86) PCT No.: PCT/DE97/00161

§ 371 (c)(1),
(2), (4) Date: Apr. 26, 1999

(87) PCT Pub. No.: WO97/28454

PCT Pub. Date: Aug. 7, 1997

(30) Foreign Application Priority Data

Jan. 31, 1996 (DE) ......................................... 196 05 022

(51) Int. Cl.[7] .............................................. G06F 19/00
(52) U.S. Cl. ....................................................... 702/59
(58) Field of Search ..................... 702/58, 59; 324/512, 324/522, 531; 361/42, 47, 64, 65, 66, 68

(56) References Cited

U.S. PATENT DOCUMENTS

| | | | | |
|---|---|---|---|---|
| 4,317,151 A | * | 2/1982 | de Mesmaeker et al. ..... | 361/69 |
| 4,325,098 A | * | 4/1982 | Heller .......................... | 361/82 |
| 4,528,611 A | * | 7/1985 | Udren .......................... | 361/81 |
| 4,737,879 A | * | 4/1988 | Andersson et al. ........... | 361/80 |
| 4,896,241 A | * | 1/1990 | Li et al. ....................... | 361/66 |
| 5,455,776 A | * | 10/1995 | Novosel ..................... | 364/492 |
| 5,661,664 A | * | 8/1997 | Novosel et al. ............. | 364/492 |
| 5,793,750 A | * | 8/1998 | Schweitzer, III et al. ... | 370/242 |
| 5,839,093 A | * | 11/1998 | Novosel et al. ............... | 702/59 |
| 5,956,220 A | * | 9/1999 | Novosel et al. ............... | 361/62 |
| 6,256,592 B1 | * | 7/2001 | Roberts et al. ............... | 702/59 |

FOREIGN PATENT DOCUMENTS

| | | |
|---|---|---|
| DE | 2 112 136 | 9/1972 |
| EP | 0 275 779 | 7/1988 |
| EP | 0 358 488 | 3/1990 |

OTHER PUBLICATIONS

Novosel et al., "Fault Locating Using Digital Relay Data", IEEE, Jul. 1995.*
Redfern, M. et al, A New Approach to Digital Current Differential Protection for Low and Medium Voltage Feeder Circuits Using a Digital Voice–Frequency Grade Communications Channel, IEEE Transactions on Power Delivery, Jul. 9, 1994, pp. 1352–1358.
Cook, V. et al., Fundamentals Aspects of Fault Location Algorithms Used in Distance Protection, IEEE Proceedings, vol. 133, Pt.C, No. 6, Sep. 1986, pp. 359–368.
Yang, H. et al., A New Neural Networks Approach to On–Line Fault Section Estimation Using Information of Protective Relays and Circuit Breakers, IEEE Transactions on Power Delivery, Jan. 9, 1995, p. 62.
Johns, A. et al., Accurate Fault Location Technique for Power Transmission Lines, IEEE Proceedings, vol. 137, Pt.C, No. 6, Nov. 1990, pp. 395–402.
Siemens Gerätehandbuch, "7SA 511 V3.0 Digitaler Abzweigschutz", 1995, p. 62.*

* cited by examiner

Primary Examiner—Patrick Assouad
(74) Attorney, Agent, or Firm—Kenyon & Kenyon

(57) ABSTRACT

A method of detecting a fault in a monitored section of an electric line. A release signal and a direction signal are generated, in the event of a fault, by a measuring unit fitted at each end of every section of the line. The direction signal is transmitted via a low-transmission-capacity line from one measuring unit to another measuring unit. Each measuring unit produces, after generating the release signal, intermediate parameters which are suitable for calculating the location of the fault. The intermediate parameters are transmitted via the data-transmission line to the other measuring unit in the section where, in each case, a value is obtained indicating the location of the fault.

3 Claims, 2 Drawing Sheets

METHOD OF DETECTING A FAULT IN A MONITORED SECTION OF AN ELECTRIC TRANSMISSION LINE USING DISTANCE PROTECTION TECHNIQUES

FIELD OF THE INVENTION

The present invention concerns a method of detecting a fault in a monitored section of an electric transmission line using the distance protection principle, where a release signal and a direction signal are generated in the event of a fault by one measuring unit at each end of the line section monitored using current and voltage values measured on the monitored section of electric transmission line, and the direction signal is transmitted to the other measuring unit over a low-transmission-capacity data line running between the measuring units.

BACKGROUND INFORMATION

Siemens Handbook "7SA511 V3 Digitaler Abszwergschutz" (7SA511 V3 Digital Feeder Protection) describes a method for reliably detecting a fault on a monitored section of an electric transmission line, in the event of a fault, a release signal is generated at both ends of the monitored section of line using the distance protection principle, thereby prompting a circuit-breaker to isolate that section from the electric transmission line. Since a fault can be detected reliably from each end of the monitored section of line over only approximately 80% of the length of the monitored section of line by the distance protection method in the event of a fault, a direction signal is generated with the known method at each end of the monitored section of line in the event of a fault, with the information that the fault lies in the direction of the other end. The direction signal is transmitted over a data transmission line to the other end and to the other measuring unit. Since the direction signal is a simple binary signal or is transmitted serially, a simple line with a low transmission capacity is used as the data transmission line. With the direction signal received, a fault on the monitored section of line can be detected with a high reliability, taking into account the direction signal generated at the other end, even if the fault has occurred in the end area or the initial area of the monitored section of line.

European Patent Application No. 0 275 779 describes a protective arrangement in which a directional relay is present at each end of the monitored line section. The directional relays at the ends of the monitored section of line are linked together by a wireless transmission channel to permit signal exchange.

In addition, European Patent Application No. 0 358 488 describes a protective circuit within which fault-relevant current and voltage quantities are measured at each end of a monitored section of line and exchanged between the two ends over a data connection. At each end there is a microprocessor which determines the location of a fault with measured current and voltage quantities that are relevant to the fault.

Furthermore, Unexamined German Patent No. 2 112 136 describes an arrangement for monitoring a section of an electric transmission line equipped with a distance protection system on each end of the section of line to be monitored. The arrangement also has a circuit for measuring the distance to the fault location. At each end of the monitored section of line, the circuit has a memory in which current and voltage values derived from the electric transmission line are stored after analog-digital conversion. In the event of a fault on the monitored section of line, the values stored in the memory are transmitted over a data transmission system to an analysis unit with a downstream computer to locate the fault on the monitored section of line. The data transmission system must be of a relatively high quality here, because a relatively large volume of data must be transmitted.

SUMMARY OF THE INVENTION

An object of the present invention is to provide a method of detecting a fault on a monitored section of an electric transmission line with which not only is it possible to generate a release signal by the distance protection principle, but also a measured quantity indicating the location of the fault on the monitored section of line can be generated by a simple procedure.

To achieve this object in accordance with the present invention, intermediate parameters suitable for calculating the location of the fault are produced in each measuring unit after the release signal is generated and are transmitted over the data transmission line to the other measuring unit. A measured quantity indicating the location of the fault is derived in each measuring unit from its own intermediate parameter and the transmitted intermediate parameter.

An important advantage of the method according to the present invention is that no additional data transmission system is needed to accurately determine the location of the fault, but instead the data transmission line used for transmitting the direction signals in the distance protection measurement can be used. No additional (expensive) data transmission system is needed for locating faults. Therefore, the data transmission line can be used for locating faults because it is no longer needed after tripping and after the direction signals have been sent. This is made possible by the fact that according to the present invention, intermediate parameters suitable for calculating the location of faults are formed in the measuring units for locating faults. These intermediate parameters can be transmitted readily over the low-transmission-capacity data line.

In the method according to the present invention, different intermediate parameters can be produced. It is regarded as advantageous if a measured impedance quantity characteristic of a particular fault location is supplied as the intermediate parameter in each measuring unit. With appropriate design, the measuring unit is capable of accurately measuring the location of the fault only from the impedance quantity transmitted from the other measuring unit. This type of fault locating is described in Cook, V. et al., Fundamental Aspects of Fault Location Algorithms Used in Distance Protection, IEEE Proceedings, Vol. 133, Pt. C, No. 6, September 1986.

In another advantageous embodiment of the method according to the present invention, characteristic current and voltage vectors for the particular fault location are supplied as intermediate parameters in each measuring unit. Such intermediate parameters can also be transmitted over a low-transmission-capacity data line. Such a method of locating faults is also described in Johns, A. et al., Accurate Fault Location Technique for Power Transmission Lines," IEEE Proceedings, Vol. 137, Pt. C, No. 6, November 1990.

DETAILED DESCRIPTION

Figure 1:
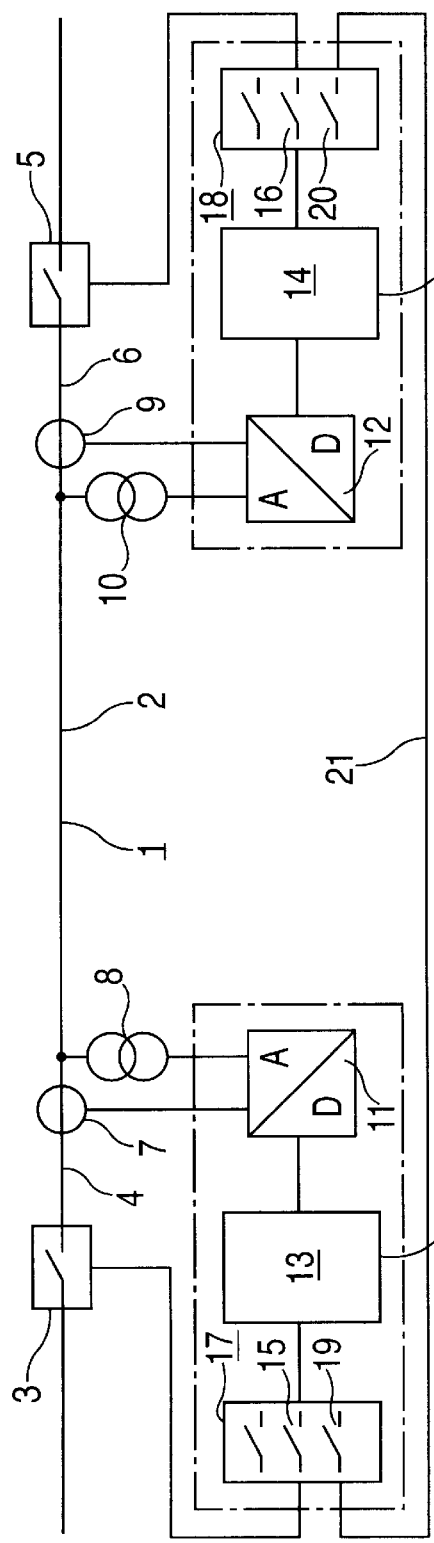
FIG. 1: shows an embodiment of an arrangement for carrying out the method according to the present invention.

FIG. 1 shows an electric transmission line 1 having a section 2 of line to be monitored. This section 2 is limited by a circuit-breaker 3 at one end 4 of section 2 and by another circuit-breaker 5 at the other end 6 of monitored section 2. Currents and voltages corresponding to the currents and voltages of electric transmission line 1 are sent to one analog-digital converter unit 11 at one end 4 of section 2 and to another analog-digital converter unit 12 at the other end 6 over a current transformer 7 and a voltage transformer 8 shown schematically in FIG. 1) at end 4 and another current transformer 9 and another voltage transformer 10 at the other end 6 of monitored line section 2. A measuring unit 13 or 14 in the form of a process computer is provided downstream from analog-digital converter units 11 and 12, respectively.

Transmission line 1 is shown as a single-phase line for the sake of simplicity; it is in fact a three-phase line, which is why multiple current and voltage transformers are also provided to detect the required measured quantities.

In measuring units 13 and 14, a release signal is generated from digitized current and voltage values sent to them in the event of a fault, e.g., a short circuit on monitored section 2, thereby actuating a switch contact 15 or 16 of switch equipment 17 or 18. This delivers an actuating pulse to circuit-breaker 3 or 5, causing the latter to open and thus isolate monitored section 2 from electric transmission line 1. A binary direction signal is transmitted from one measuring unit 13 to another measuring unit 14 and from the other measuring unit 14 to the one measuring unit 13 over a low-transmission-capacity line 21 by way of additional switch contacts 19 and 20 of switch equipment 17 and 18.

After measuring units 13 and 14 have generated a release signal, optionally taking into account the direction signals exchanged over data transmission line 21, data transmission line 21 is no longer needed for fault detection by the distance protection principle. It is then used according to the present invention for binary transmission of intermediate parameters for locating faults in that measuring units 13 and 14 produce these intermediate parameters for locating faults after release signals are sent. Since these intermediate parameters are composed only of a measured impedance quantity and an impedance vector or current and voltage vectors, data transmission line 21 can readily be used for transmitting these intermediate parameters, so that measuring units 13 and 14 can now locate a fault accurately from both ends of the monitored section of line using the received intermediate parameters by the essentially known methods of locating faults described above, and therefore they operate with a high precision.

Figure 2:
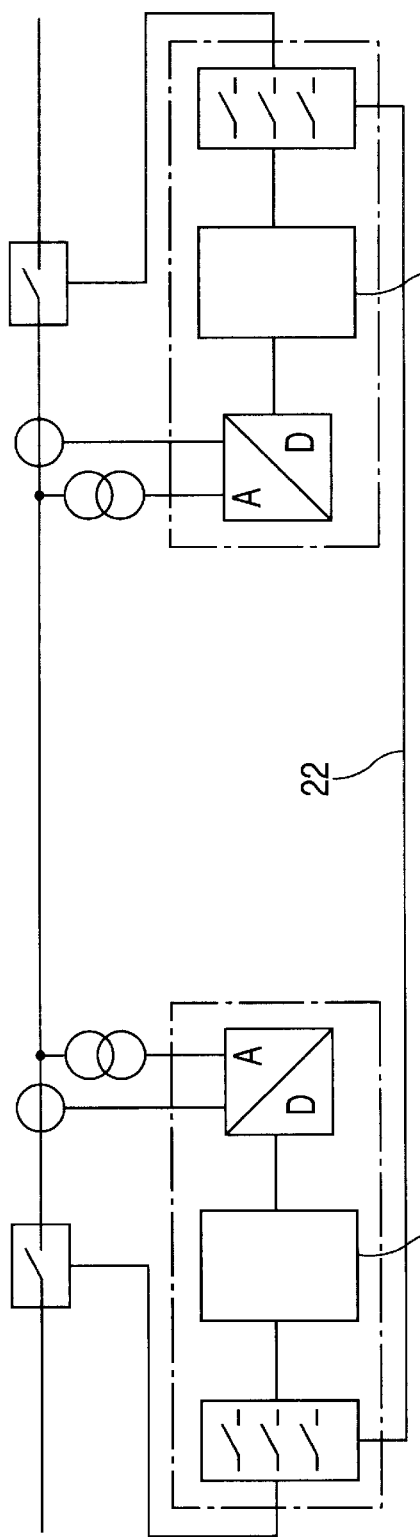
FIG. 2: shows another embodiment of an arrangement for carrying out the method according to the present invention.

The embodiment according to FIG. 2 corresponds essentially to that according to FIG. 1. The main difference between the embodiment according to FIG. 2 and that according to FIG. 1 is that a low-transmission-capacity data line 22 is used here as a serial transmission channel. The intermediate parameters needed for location of faults are exchanged serially here between measuring units 13 and 14 over data transmission line 22.

Figure 3:
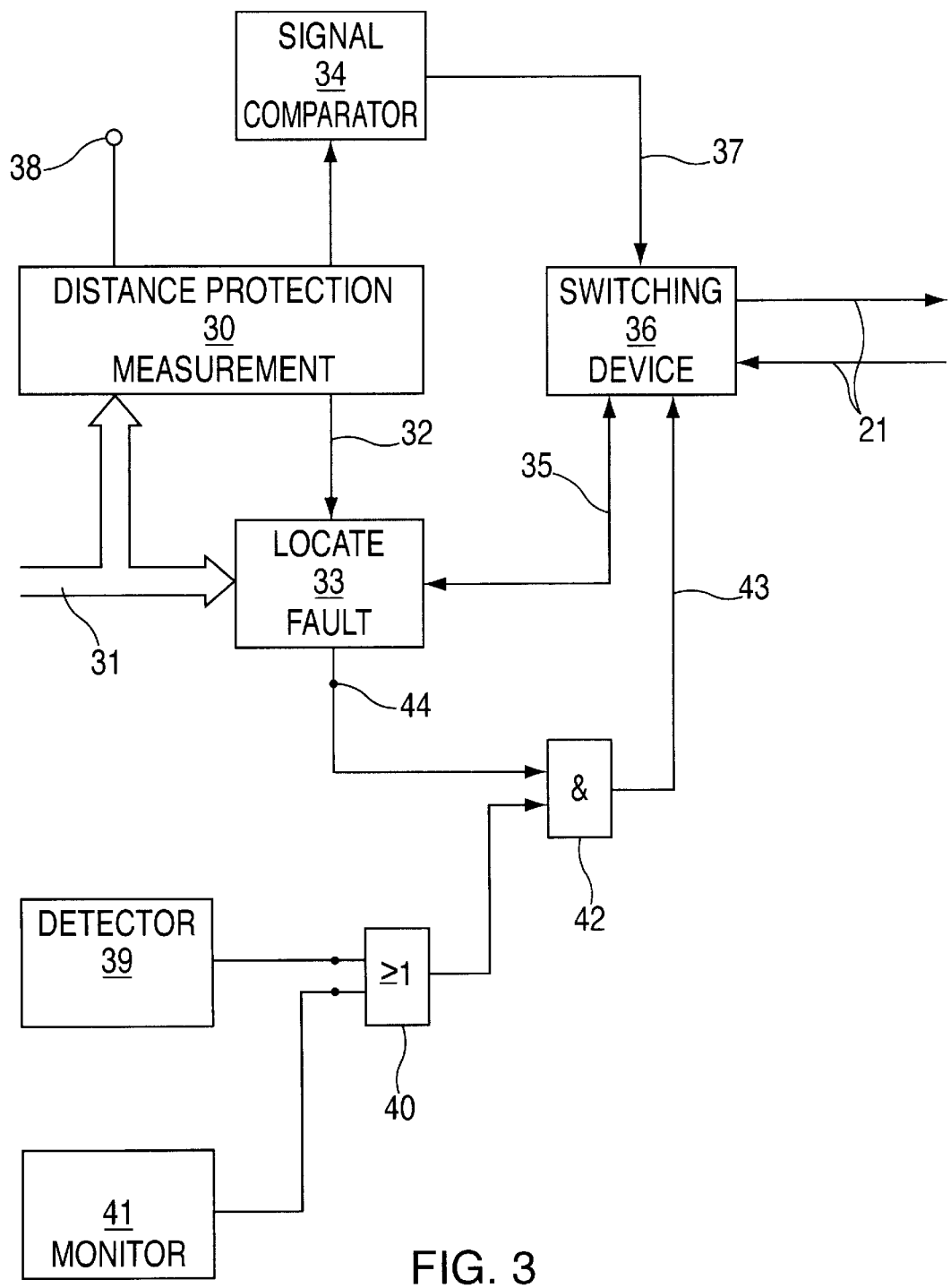
FIG. 3: shows a block diagram to further illustrate the execution of one embodiment of the method according to the present invention.

As pointed out previously, the embodiment according to FIG. 3 serves only to illustrate the process taking place in measuring units 13 and 14. Therefore the individual blocks of this figure should not be regarded as circuit units, but instead are simply function blocks. FIG. 3 shows only the operation of a measuring unit 13 or 14 at one end of the monitored section of line, because the method takes place similarly at the other end.

FIG. 3 shows that data supplied by analog-digital converter unit 11 or 12 (not shown here) according to FIG. 1 is sent over a data bus 31 to a block 30 which performs the distance protection measurement. In the event a fault is detected on the monitored section of line, not only is a tripping signal generated in block 30 and sent over a connection 32 to a block 33 for locating the fault, but also a direction signal 35 is transmitted to a block 34 for signal comparison.

Block 33 for locating the fault is also on data bus 31 and generates current and voltage vectors I and U, which indicate the status of the monitored section of line before occurrence of a fault and also during a fault. Block 33 is connected by a connection 35 to a switching device 36 by which data transmission line 21 according to FIG. 1 or 22 according to FIG. 2 can be connected optionally to block 34 or block 33. Switching device 36 is normally switched so that data transmission line 21 is connected to block 34 over a connection 37.

If, after tripping, a release command has been sent by block 30 over an output 38 to a circuit-breaker 3 or 5 (not shown), then circuit-breaker 3 or 5 is opened. The open status is detected by a detector 39 for detecting the open status of circuit-breaker 3 or 5, and a suitable signal is sent to one input of a logic element 40 which has a monitor 41 connected at its other input for checking the status of an automatic recloser. An AND element 42 downstream from logic element 40 sends a reversing command to switching device 36 over a connection 43 when a signal is applied to the output of logic element 40 and also to an output 44 of block 33 for locating a fault.

After switching device 36 reverses, data transmission line 21 is connected directly to block 33 over connection 35, so that intermediate parameters can be exchanged in the form of current and voltage vectors for locating a fault. A measured quantity indicating the precise location of the fault is generated in block 33 from the quantities detected there and the intermediate parameters received.

What is claimed is:

1. A method of detecting a fault on a monitored section of an electric transmission line, comprising the steps of:

detecting a fault at a location on the monitored section;

measuring, with a first measuring unit at a first end of the monitored section, a first current value and a first voltage value on the measured section when the fault is detected;

measuring, with a second measuring unit at a second end of the monitored section, a second current value and a second voltage value on the measured section when the fault is detected;

generating, with the first measuring unit, a first release signal and a first direction signal as a function of the first current value and the first voltage value, the first release signal and the first direction signal indicating a first characterization of the detected fault;

generating, with the second measuring unit, a second release signal and a second direction signal as a function of the second current value and the second voltage value, the second release signal and the second direction signal indicating a second characterization of the detected fault;

transmitting the first direction signal from the first measuring unit to the second measuring unit over a low-transmission-capacity data line;

transmitting the second direction signal from the second measuring unit to the first measuring unit over the low-transmission-capacity data line;

after generating the first release signal, generating by the first measuring unit a first intermediate parameter for calculating the location of the fault;

after generating the second release signal, generating by the second measuring unit a second intermediate parameter for calculating the location of the fault;

transmitting the first intermediate parameter from the first measuring unit to the second measuring unit over the low-transmission-capacity data line;

transmitting the second intermediate parameter from the second measuring unit to the first measuring unit over the low-transmission-capacity data line;

generating a first measured quantity in the first measuring unit as a function of the first intermediate parameter and the second intermediate parameter, the first measured quantity indicating the location of the fault; and generating a second measured quantity in the second measuring unit as a function of the second intermediate parameter and the first intermediate parameter, the second measured quantity indicating the location of the fault.

2. The method according to claim 1, wherein the first intermediate parameter includes a first measured impedance quantity characteristic of the location of the fault, and the second intermediate parameter includes a second measured impedance quantity characteristic of the location of the fault.

3. The method according to claim 1, wherein the first intermediate parameter includes a first current vector and a first voltage vector, and the second intermediate parameter includes a second current vector and a second voltage vector.

* * * * *